US012772910B2

(12) United States Patent
Lv

(10) Patent No.: US 12,772,910 B2
(45) Date of Patent: Oct. 20, 2026

(54) SEMICONDUCTOR STRUCTURE WITH CHIPSET INCLUDING MULTIPLE CHIPS, MEMORY, AND METHOD OF FORMING SAME

(71) Applicant: CHANGXIN MEMORY TECHNOLOGIES, INC., Hefei City (CN)

(72) Inventor: Kaimin Lv, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 352 days.

(21) Appl. No.: 18/527,739

(22) Filed: Dec. 4, 2023

(65) Prior Publication Data

US 2024/0105706 A1 Mar. 28, 2024

Related U.S. Application Data

(63) Continuation of application No. PCT/CN2022/124200, filed on Oct. 9, 2022.

(30) Foreign Application Priority Data

Sep. 5, 2022 (CN) ......................... 202211080235.7

(51) Int. Cl.
*H10W 90/00* (2026.01)
*H10P 72/70* (2026.01)
(Continued)

(52) U.S. Cl.
CPC ............ *H10W 90/00* (2026.01); *H10P 72/74* (2026.01); *H10P 72/7416* (2026.01);
(Continued)

(58) Field of Classification Search
CPC ... H10W 90/20; H10W 90/26; H10W 90/722; H10W 90/291; H10W 72/20;
(Continued)

(56) References Cited

U.S. PATENT DOCUMENTS 7,193,311 B2 3/2007 Ogawa et al.
2009/0004859 A1 1/2009 Kimura et al.
(Continued)

FOREIGN PATENT DOCUMENTS

CN 1491439 A 4/2004
CN 109671680 A 4/2019
(Continued)

OTHER PUBLICATIONS

International Search Report cited in PCT/CN2022/124200 mailed Mar. 22, 2023, 7 pages.
(Continued)

*Primary Examiner* — Didarul A Mazumder
(74) *Attorney, Agent, or Firm* — Syncoda LLC; Feng Ma

(57) ABSTRACT

The present disclosure relates to the technical field of semiconductors and provides a semiconductor structure, a method of forming same, and a memory. The method of forming a semiconductor structure of the present disclosure includes: providing a carrier board; forming a chipset on one side of the carrier board, where the chipset includes multiple chips stacked in a direction perpendicular to the carrier board; where among multiple chips, an orthographic projection of a chip closer to the carrier board on the carrier board is within an orthographic projection of a chip farthest from the carrier board on the carrier board; forming an insulating dielectric layer covering the chipset; and performing a grinding process to expose a predetermined surface of the chip farthest from the carrier board outside the insulating dielectric layer.

19 Claims, 4 Drawing Sheets

(51) Int. Cl.
*H10W 74/15* (2026.01)
*H10W 90/20* (2026.01)

(52) U.S. Cl.
CPC .......... *H10W 74/15* (2026.01); *H10W 90/297* (2026.01); *H10W 90/724* (2026.01); *H10W 90/734* (2026.01)

(58) Field of Classification Search
CPC ..... H10W 90/00; H10W 40/22; H10W 74/01; H10W 74/111; H10W 80/00; H10W 74/117; H10W 20/20; H10W 74/014; H10W 74/121; H10W 99/00; H10W 74/15; H10W 90/297; H10W 90/724; H10W 90/734; H10W 72/851; H10W 40/00; H10W 74/114; H10W 74/129; H10P 72/7416; H10P 72/74; H10P 54/00; H10P 72/7402; H10P 72/7418; H10P 72/7424; H10P 52/00
USPC .......................................... 257/737; 438/613

See application file for complete search history.

(56) References Cited

U.S. PATENT DOCUMENTS

2015/0008580 A1 1/2015 Joh
2017/0323858 A1* 11/2017 Hellmund ............ H10D 30/028
2017/0338214 A1* 11/2017 Uzoh .................. H10W 74/014
2018/0286835 A1* 10/2018 Nah ...................... H10W 74/01
2021/0375709 A1* 12/2021 Ko ...................... H10W 74/117
2021/0375827 A1* 12/2021 Chen ..................... H10W 90/00
2022/0028834 A1 1/2022 Lee et al.

FOREIGN PATENT DOCUMENTS

CN 111312697 A 6/2020
CN 213692007 U 7/2021

OTHER PUBLICATIONS

Extended European search report in application No. 22945114, mailed on Aug. 29, 2024.
European patent office action in application No. 22945114.1, mailed on Jun. 13, 2025.

* cited by examiner

SEMICONDUCTOR STRUCTURE WITH CHIPSET INCLUDING MULTIPLE CHIPS, MEMORY, AND METHOD OF FORMING SAME

CROSS-REFERENCE TO RELATED APPLICATIONS

This is a continuation of International Patent Application No. PCT/CN2022/124200, filed on Oct. 9, 2022, which claims priority to Chinese Patent Application No. 202211080235.7, titled "SEMICONDUCTOR STRUCTURE, METHOD OF FORMING SAME, AND MEMORY" and filed on Sep. 5, 2022. The disclosures of International Patent Application No. PCT/CN2022/124200 and Chinese Patent Application No. 202211080235.7 are incorporated herein by reference in their entireties.

TECHNICAL FIELD

The present disclosure relates to the technical field of semiconductors, and in particular to a semiconductor structure, a method of forming same, and a memory.

BACKGROUND

The dynamic random access memory (DRAM) is widely applied to mobile devices such as mobile phones and tablet computers due to the advantages of small size, high integration, and high transmission speed. In order to increase the storage capacity of the memory, it is common to stack multiple chips together.

After the chips are stacked together, an insulating layer is arranged on the surface and periphery of each chip. Once the insulating layer is formed, the surface of the insulating layer is ground to expose the surface of the top chip. However, during the grinding process, there is a risk of damaging the surface of the chip, which can affect the appearance of the product.

It should be noted that the information disclosed above is merely intended to facilitate a better understanding of the background of the present disclosure, and may include information that does not constitute the prior art known to those of ordinary skill in the art.

SUMMARY

According to an aspect of the present disclosure, a method of forming a semiconductor structure is provided, including:

providing a carrier board;

forming a chipset on one side of the carrier board, where the chipset includes multiple chips stacked in a direction perpendicular to the carrier board; where among multiple chips, an orthographic projection of a chip closer to the carrier board on the carrier board is within an orthographic projection of a chip farthest from the carrier board on the carrier board;

forming an insulating dielectric layer covering the chipset; and performing a grinding process to expose a predetermined surface of the chip farthest from the carrier board outside the insulating dielectric layer.

According to one aspect of the present disclosure, a semiconductor structure is provided, including:

a substrate board;

a chipset, arranged on one side of the substrate board and including multiple chips stacked in a direction perpendicular to the substrate board, where among multiple chips, an orthographic projection of a chip closer to the substrate board on the substrate board is within an orthographic projection of a chip farthest from the substrate board on the substrate board; and an insulating layer, covering the periphery of the chipset, where a predetermined surface of the chip farthest from the substrate board is exposed outside the insulating layer.

According to one aspect of the present disclosure, a memory is provided, including the semiconductor structure according to any one of the foregoing implementations.

BRIEF DESCRIPTION OF THE DRAWINGS

The accompanying drawings incorporated into the specification and constituting part of the specification illustrate the embodiments of the present disclosure, and serve, together with the specification, to explain the principles of the present disclosure. Apparently, the accompanying drawings in the following description show merely some embodiments of the present disclosure, and those of ordinary skill in the art may still derive other accompanying drawings from these drawings without creative efforts.

REFERENCE NUMERALS

Figure 1:
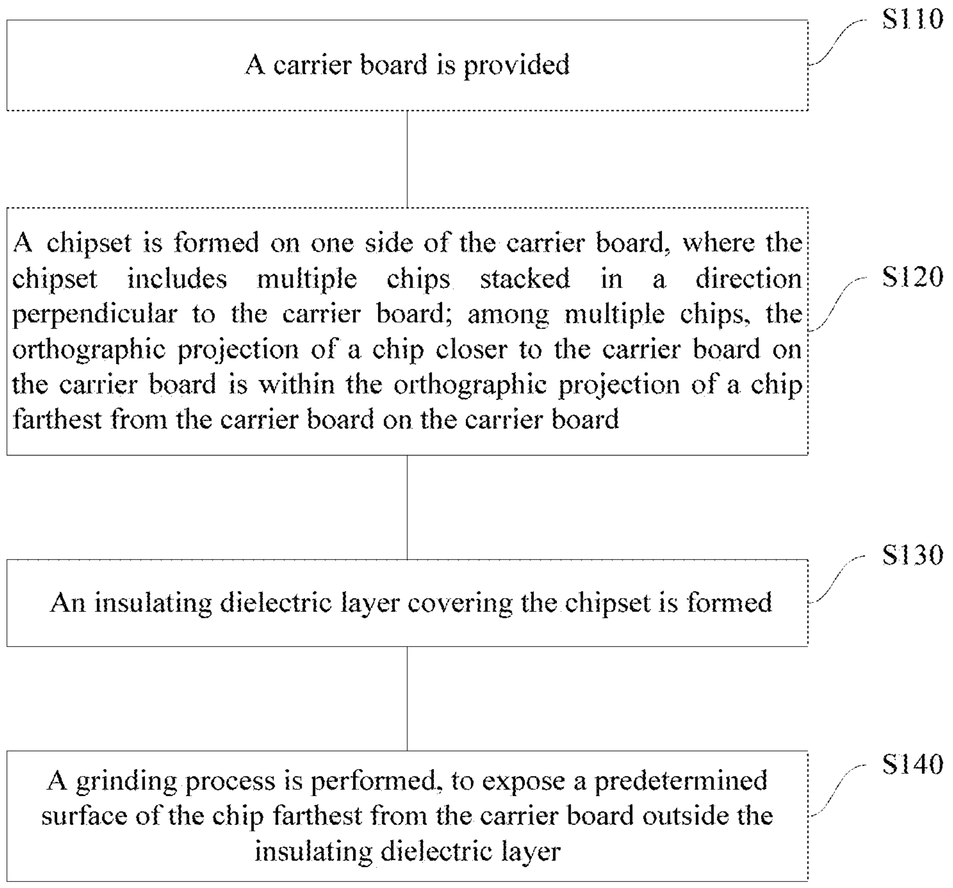
FIG. 1 is a schematic diagram of a method of forming a semiconductor structure according to an embodiment of the present disclosure.

1. substrate board; 2. chipset; 21. chip; 211. top chip; 212. bottom chip; 3. insulating dielectric layer; 4. insulating layer; 5. conductive structure; 51. conductive unit; 6. logic chip; 7. insulating fill layer; 8. adhesive layer; 100. carrier board; 200. insulating adhesive.

DETAILED DESCRIPTION

Exemplary embodiments will be illustrated below comprehensively with reference to the accompanying drawings. However, the exemplary implementations may be implemented in various forms, and may not be construed as being limited to those illustrated herein. On the contrary, these implementations are provided to make the present disclosure comprehensive and complete and to fully convey the concept of the exemplary implementations to those skilled in the art. The same reference numerals in the figures indicate the same or similar structures, and thus their detailed descriptions will be omitted. Besides, the accompanying drawings are merely exemplary illustrations of the present disclosure, and are not necessarily drawn to scale.

Although relative terms such as "upper" and "lower" are used in this specification to describe the relative relationship of one component of an icon to another, these terms are used in this specification only for convenience, for example, according to the orientation of the examples illustrated in the accompanying drawings. It can be understood that if the apparatus of the icon is turned upside down, the components described as "upper" become the "lower" components. When a structure is "on" other structures, it may mean that the structure is integrally formed on other structures, or that the structure is "directly" disposed on other structures, or that the structure is "indirectly" disposed on other structures through another structure.

The terms "one", "a", "the", "said", and "at least one" are used to indicate the presence of one or more elements/components/and the like; the terms "includes" and "has" are used to indicate an open-ended inclusion and to mean that additional elements/components/and the like may exist in addition to the listed elements/components/and the like.

An embodiment of the present disclosure provides a method of forming a semiconductor structure. FIG. 1 is a schematic diagram of a method of forming a semiconductor structure of the present disclosure. As shown in FIG. 1, the method of forming a semiconductor structure may include step S110 to step S140.

In the step S110, a carrier board is provided.

In the step S120, a chipset is formed on one side of the carrier board, where the chipset includes multiple chips stacked in a direction perpendicular to the carrier board; among multiple chips, the orthographic projection of a chip closer to the carrier board on the carrier board is within the orthographic projection of a chip farthest from the carrier board on the carrier board.

In the step S130, an insulating dielectric layer covering the chipset is formed.

In the step S140, a grinding process is performed, to expose a predetermined surface of the chip farthest from the carrier board outside the insulating dielectric layer.

The method of forming a semiconductor structure of the present disclosure has the following beneficial effects. On one hand, multiple chips 21 are vertically stacked, which helps increase the storage capacity. On the other hand, among the chips 21, the orthographic projection of the chip 21 closer to the carrier board 100 on the carrier board 100 is within the orthographic projection of the chip 21 farthest from the carrier board 100 on the carrier board 100. In this way, the area of a top chip 211 can increase, and the thickness of an insulating layer 4 located on the periphery of the top chip 211 can reduce, without changing the overall size of the semiconductor structure. Therefore, it decreases the proportion of the insulating dielectric layer 3 during the grinding process, reduces the probability of uneven grinding due to different hardness of the insulating dielectric layer 3 and the surface of the chip 21, and lowers the probability of scratches or cracks on the surface of the top chip 211 during the grinding process, thereby improving the appearance of the product. Furthermore, because the structure formed after grinding exposes the predetermined surface of the top chip 211, the heat exchange between the chip 21 and the external environment can be increased, which improves the heat dissipation efficiency and reduces power consumption during the operation of the chip 21.

The steps of the method of forming a semiconductor structure in the present disclosure are illustrated in detail below.

As shown in FIG. 1, in the step S110, a carrier board is provided.

Figure 2:
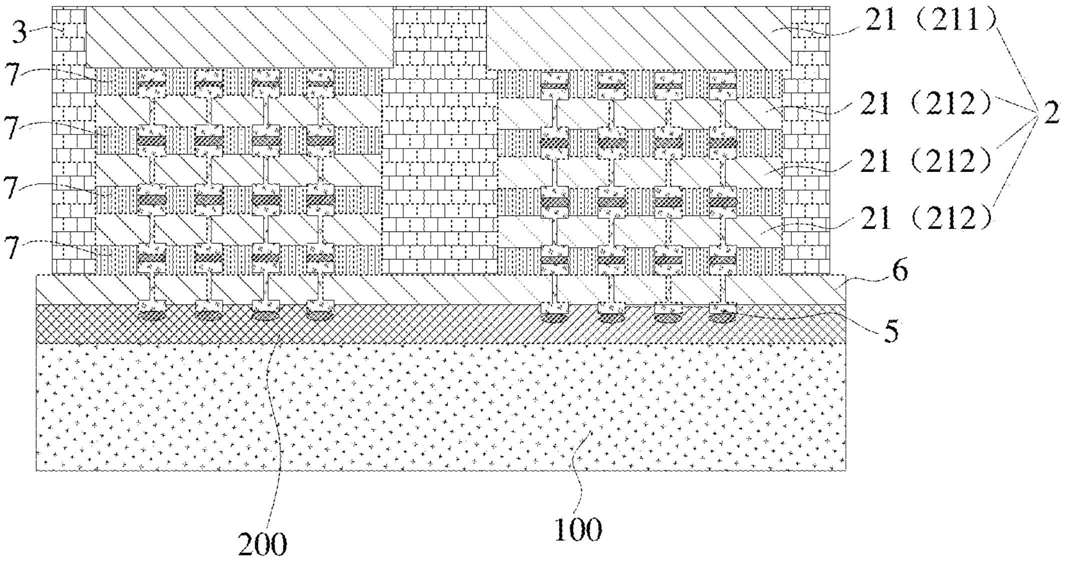
FIG. 2 is a schematic diagram of a semiconductor structure according to an embodiment of the present disclosure.

FIG. 2 is a schematic diagram of a semiconductor structure according to an embodiment of the present disclosure. As shown in FIG. 2, the carrier board 100 may be a flat structure and in the shape of a rectangle, a circle, an ellipse, or a polygon, or in an irregular shape. The material of the carrier board may be a semiconductor material such as silicon, but is not limited thereto. The shape and material of the carrier board 100 are not particularly limited.

As shown in FIG. 1, in the step S120, a chipset is provided on one side of the carrier board, where the chipset includes multiple chips stacked in a direction perpendicular to the carrier board; among the chips, the orthographic projection of the chip closer to the carrier board on the carrier board is within the orthographic projection of the chip farthest from the carrier board on the carrier board.

As shown in FIG. 2, the chipset 2 may be formed on one side of the carrier board 100, and the chipset 2 may include multiple chips 21. The chipset 2 can be used in integrated circuits. For example, the chipset may be a dynamic random access memory (DRAM) or a static random access memory (SRAM), or may be a core component in a DRAM or SRAM. In some embodiments of the present disclosure, in order to reduce the size of the DRAM or SRAM while ensuring the storage capacity, the chips 21 may be stacked vertically with respect to the carrier board 100 to form the chipset 2. For example, the quantity of chips 21 in the chipset 2 may be 2, 3, 4, 5, 6, or 7. Certainly, it can be other quantities, which are not specifically limited herein.

In some embodiments of the present disclosure, all the chips 21 in the chipset 2 may be electrically connected, facilitating data transmission between multiple chips 21. This helps transmit data from multiple different chips 21 into the same chip 21, for simultaneously transmitting electrical signals from the chips 21 in the chipset 2 to a substrate board through the same chip 21. In this way, each chip 21 can be connected to an external circuit in the substrate board, thereby enabling signal transmission.

In some embodiments of the present disclosure, all the chips 21 in the chipset 2 may be distributed at intervals along the direction perpendicular to the carrier board 100. For example, the chips 21 may be distributed along the direction perpendicular to the carrier board 100 at the same intervals. For instance, adjacent chips 21 may be spaced apart by a preset distance. Certainly, the spacings between the chips 21 do not have to be exactly same. For example, the spacing between at least two chips 21 among multiple chips 21 may be different from the spacing between other adjacent chips 21.

In some embodiments of the present disclosure, the preset distance can range from 10 μm to 150 μm. For example, the preset distance may be 10 μm, 40 μm, 70 μm, 100 μm, 130 μm, or 150 μm. Certainly, the preset distance may be other values, which are not listed here.

In one exemplary embodiment of the present disclosure, the chip 21 may have a sheet-like structure, and may be in the shape of a rectangle, a circle, an ellipse, or in an irregular shape, which is not specifically limited herein. The thickness of each chip 21 may be the same or different, which is not specifically limited herein. For example, the thickness of the chip 21 may range from 40 μm to 80 μm. For instance, the thickness may be 40 μm, 50 μm, 60 μm, 70 μm, or 80 μm. Certainly, other thicknesses are also possible, which are not listed here.

In some embodiments of the present disclosure, the chips 21 in the chipset 2 can have the same thickness. For example, the thickness of each chip 21 may be 50 μm, or each chip 21 may have a thickness of 60 μm, or each chip 21 may have a thickness of 70 μm. Certainly, each chip 21 may have other thicknesses, which are not listed here.

In one exemplary embodiment of the present disclosure, the chip 21 may include a substrate and a circuit module. The circuit module may be arranged on a surface of the substrate. In at least some of the chips 21, the surface of the substrate on which the circuit module is arranged may face towards the carrier board 100, while a surface without the circuit module may face towards a side of the chip 21 away from the carrier board 100. For example, in the substrate of the chip 21 that is farthest from the carrier board 100, the surface with the circuit module may face towards the carrier board 100. For instance, the substrate may be a wafer.

In one exemplary embodiment of the present disclosure, among the chips 21 in the chipset 2, the orthographic projection of the chip 21 closer to the carrier board 100 on the carrier board 100 is within the orthographic projection of the chip 21 farthest from the carrier board 100 on the carrier board 100. In order to better distinguish, the chip 21 farthest from the carrier board 100 may be defined as a top chip 211, and the chip 21 located between the top chip 211 and the carrier board 100 may be referred to as a bottom chip 212. There may be one or more bottom chips 212, which is not specifically limited here. In the direction parallel to the carrier board 100, the bottom chip 212 may have a first width, while the top chip 211 may have a second width, where the second width is greater than the first width. That is, in the chipset 2, the top chip 211 has a larger area than any other chip 21 in the chipset 2.

It should be noted that in the chipset 2, the chips 21 which are located between the top chip 211 and the carrier board 100 may have the same area or the different areas. That is, the chips 21 of the bottom chips 212 may have the same area or the different areas, which is not specifically limited here.

In some embodiments of the present disclosure, an insulating fill layer 7 may be provided between adjacent chips 21. The adjacent chips 21 can be insulated and isolated by the insulating fill layer 7, thereby preventing signal crosstalk or coupling between the chips 21.

In one exemplary embodiment of the present disclosure, the material of the insulating fill layer 7 may be an insulating adhesive or encapsulation adhesive. The insulating fill layer 7 can isolate the chips 21 from external water and oxygen, to prevent the external water and oxygen from entering the internal structure of the chips 21, thereby protecting the internal structure of the chips 21 from erosion by water and oxygen and extending the lifespan of the chips 21.

In some embodiments of the present disclosure, gaps between adjacent chips 21 can be filled with the insulating fill layer 7. The insulating fill layer 7 can support the gap between two adjacent chips 21 and help balance the stress between the two adjacent chips 21, thereby reducing the warping of the chips 21 and improving the yield of the product.

Figure 3:
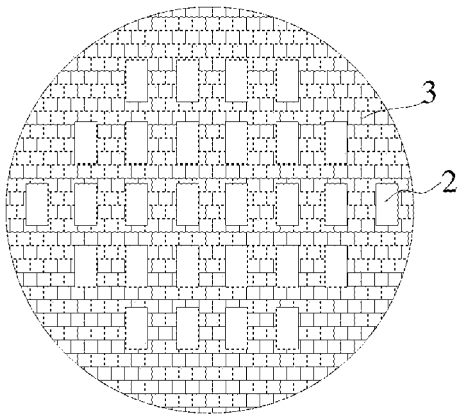
FIG. 3 is a top view of a semiconductor structure according to an embodiment of the present disclosure.

FIG. 3 is a top view of a semiconductor structure according to an embodiment of the present disclosure. As shown in FIG. 2 and FIG. 3, there may be multiple chipsets 2. The chipsets 2 are formed on the same side of the carrier board 100. The orthographic projection of each chipset 2 on the carrier board 100 may be within an array region. For example, the chipsets 2 can be distributed at intervals and arranged in an array within the array region of the carrier board 100.

Figure 4:
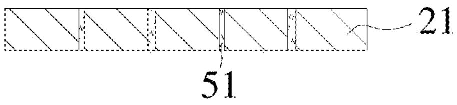
FIG. 4 is a schematic diagram of a conductive unit according to an embodiment of the present disclosure.

In some embodiments of the present disclosure, as shown in FIG. 4, the adjacent chips 21 in the same chipset 2 are electrically connected. For example, the adjacent chips 21 can be electrically connected through a conductive unit 51, and multiple spaced conductive units 51 may be arranged between the adjacent chips 21. In the direction perpendicular to the carrier board 100, the conductive units 51 in different chips 21 may be interconnected to form conductive structures 5.

It should be noted that, as shown in FIG. 2, when the insulating fill layer 7 is formed between adjacent chips 21, the conductive structure 5 can penetrate through the insulating fill layer 7.

As shown in FIG. 1, in the step S130, an insulating dielectric layer covering the chipset is formed.

Figure 5:
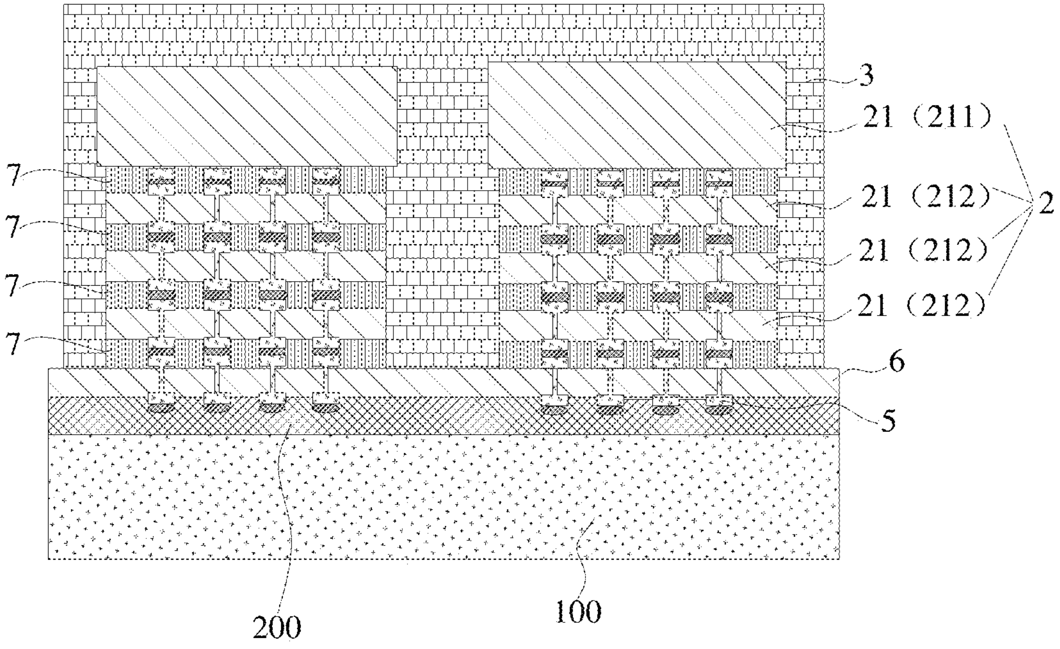
FIG. 5 is a schematic diagram after step S130 is completed according to an embodiment of the present disclosure.

As shown in FIG. 3 and FIG. 5, the insulating dielectric layer 3 may be formed simultaneously on the side wall and top of the chipset 2 by the methods such as chemical vapor deposition, physical vapor deposition, or atomic layer deposition. Certainly, other methods can also be used to form the insulating dielectric layer 3, which are not listed here. The material of the insulating dielectric layer 3 may be an insulating material. The chipset 2 can be insulated and isolated by the insulating dielectric layer 3, to prevent coupling or short-circuiting between the chipset 2 and other surrounding structures, thus improving the product yield.

It should be noted that when multiple chipsets 2 are formed on one side of the carrier board 100, gaps between the chipsets 2 can be filled with the insulating dielectric layer 3, thereby avoiding coupling or short-circuiting between adjacent chipsets 2 and improving the product yield.

In one exemplary embodiment of the present disclosure, in the direction parallel to the carrier board 100, adjacent bottom chips 212 may be spaced apart by a first gap, while adjacent top chips 211 may be spaced apart by a second gap. The width of the second gap may be less than the width of the first gap. For example, the width of the first gap may be greater than or equal to 200 micrometers, and the width of the second gap may be greater than or equal to 50 micrometers and less than or equal to 100 micrometers.

As shown in FIG. 1, in the step S140, the grinding process is performed to expose a predetermined surface of the chip farthest from the carrier board outside the insulating dielectric layer.

The insulating dielectric layer 3 may be ground by a grinding process. After the grinding process, the insulating dielectric layer 3 can expose the predetermined surface of the top chip 211, to increase the heat exchange between the chipset 2 and the external environment, which improves the heat dissipation efficiency and reduces power consumption during the operation of the chip 21.

In the grinding process, because the area of the top chip 211 in the chipset 2 is greater than the areas of other chips 21, the thickness of the insulating dielectric layer 3 located on the periphery of the top chip 211 is reduced without changing the overall size of the semiconductor structure. Therefore, it decreases the proportion of the insulating dielectric layer 3 during the grinding process, reduces the probability of uneven grinding due to different hardness of the insulating dielectric layer 3 and the surface of the chip 21, and lowers the probability of scratches or cracks on the surface of the top chip 211 during the grinding process, thereby improving the appearance of the product.

In some embodiments of the present disclosure, in the direction parallel to the carrier board 100, a ratio of the width of the top chip 211 to the thickness of the insulating dielectric layer 3 on the side wall of the top chip 211 may range from 5 to 20. For example, the ratio of the width of the top chip 211 to the thickness of the insulating dielectric layer 3 on the side wall of the top chip 211 may be 5, 10, 15, or 20. Certainly, the ratio may be other values, which are not listed here.

In some embodiments of the present disclosure, the thickness of the insulating dielectric layer 3 on the side wall of the top chip 211 may be greater than or equal to 50 micrometers and less than or equal to 100 micrometers. For example, the thickness of the insulating dielectric layer 3 on the side wall of the top chip 211 may be 50, 60, 70, 80, 90, or 100 micrometers. Certainly, the thickness of the insulating dielectric layer 3 on the side wall of the top chip 211 may be other values, which are not listed here.

It should be noted that in the direction perpendicular to the carrier board 100, the chips 21 between the top chip 211 and the carrier board 100 can be aligned at both ends. That is, the chips 21 in the bottom chips 212 can be aligned at both ends. The insulating dielectric layer 3 on the periphery of each chip 21 in the bottom chips 212 can have the same thickness. Moreover, the thickness of the insulating dielectric layer 3 on the periphery of each chip 21 in the bottom chips 212 can be greater than the thickness of the insulating dielectric layer 3 on the periphery of the top chip 211.

It should be noted that during the grinding process of the insulating dielectric layer 3, the insulating dielectric layer 3 is thinned in the thickness direction of the insulating dielectric layer 3, but not in the direction parallel to the carrier board 100. When there are multiple chipsets 2, the gaps between the chipsets 2 in the direction parallel to the carrier board 100 can be filled with the finally formed insulating dielectric layer 3. Moreover, during the grinding process, the insulating dielectric layer 3 and the substrate of the top chip 211 in each chipset 2 can be ground simultaneously. In this way, a surface of the chip 21 farthest from the carrier board 100 in each chipset 2, which faces away from the carrier board 100, can be exposed through one grinding process.

In some embodiments of the present disclosure, the step of performing the grinding process to expose the predetermined surface of the chip 21 farthest from the carrier board 100 outside the insulating dielectric layer 3 (i.e., step S140) may include the steps as follows.

In the step S210, the insulating dielectric layer 3 is ground and removed by a first target thickness, to expose a top surface of the top chip 211.

The insulating dielectric layer 3 can be removed by the first target thickness through the grinding process. The first target thickness is equal to the thickness of the insulating dielectric layer 3 cover the top surface of the top chip 211. After the insulating dielectric layer 3 is ground off by the first target thickness, the top surface of the top chip 211 can be exposed. That is, a surface, which is away from the circuit module, of the substrate of the top chip 211 is exposed.

For example, the first target thickness may range from 100 μm to 150 μm. The first target thickness may be 100 μm, 110 μm, 120 μm, 130 μm, 140 μm, or 150 μm. Certainly, the first target thickness can also be other values, which are not listed here.

In the step S220, the top chip 211 and the insulating dielectric layer 3 are ground and removed by a second target thickness, to expose the predetermined surface of the top chip 211, where the second target thickness is not greater than the first target thickness.

The top chip 211 and the insulating dielectric layer 3 can be further ground to thin the surface, which is away from the circuit module, of the substrate in the top chip 211. This helps reduce the thickness of the chipset 2, thereby increasing the heat dissipation efficiency during operation of the chipset 2 and further reducing power consumption.

For example, during the grinding process, the top chip 211 and the insulating dielectric layer 3 can be removed by the second target thickness. The second target thickness may be less than the thickness of the substrate in the top chip 211 and is not greater than the first target thickness. For instance, the second target thickness may range from 100 nm to 140 nm. For example, the second target thickness may be 100 nm, 110 nm, 120 nm, 130 nm, or 140 nm. Certainly, the second target thickness may be other values, which are not listed here.

Figure 6:
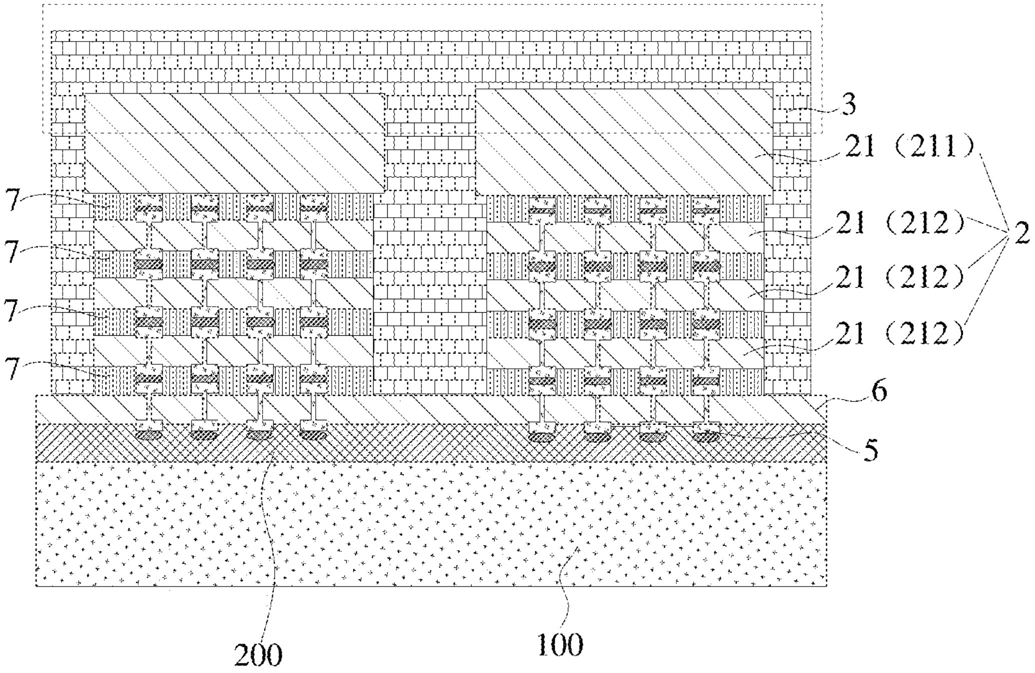
FIG. 6 is a schematic diagram of a grinding region according to an embodiment of the present disclosure.

In some embodiments of the present disclosure, a grinding device can be used to simultaneously grind the insulating dielectric layer 3 on the surface of the top chip 211 and the substrate of the top chip 211. The grinding area is indicated by the dashed box in FIG. 6. During this process, the thickness of the insulating dielectric layer 3 located at the outer periphery of the top chip 211 is relatively small, resulting in a smaller proportion of the insulating dielectric layer 3 being removed during the grinding process. To minimize the probability of surface scratches or cracks on the top chip 211 during the grinding process, a grinding head with a hardness matching the substrate can be used, thereby improving the appearance of the product.

In an exemplary embodiment of the present disclosure, the method of forming a semiconductor structure of the present disclosure may further include the step as follow.

In the step S160, a logic chip 6 between the chipset 2 and the carrier board 100 is formed, where the orthographic projection of the chipset 2 on the carrier board 100 is within the orthographic projection of the logic chip 6 on the carrier board 100.

Figure 7:
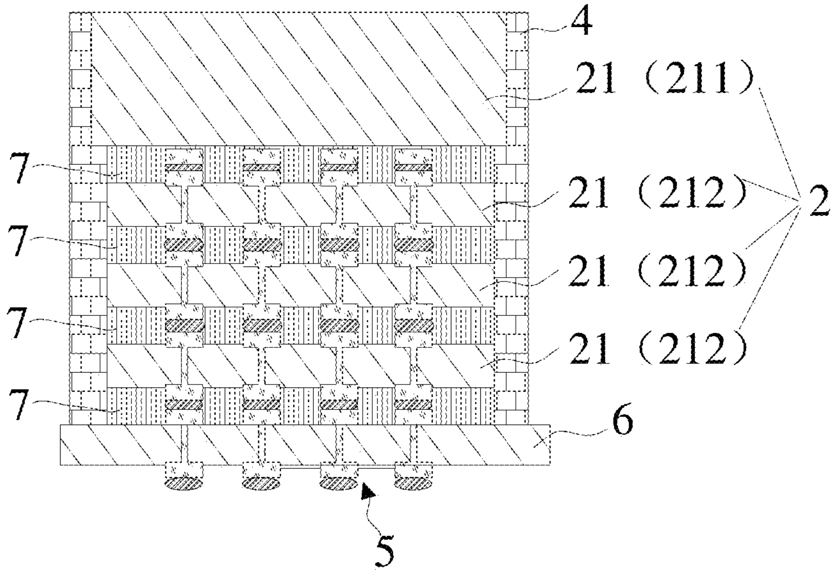
FIG. 7 is a schematic diagram of a conductive structure according to an embodiment of the present disclosure.

The logic chip 6 may be formed between the carrier board 100 and the chipset 2, and can be bonded to the carrier board 100 by an insulating adhesive 200. The insulating adhesive 200 may be a non-conductive adhesive, a UV adhesive, or the like. As shown in FIG. 7, the logic chip 6 is provided with conductive structures 5 on a side surface facing away from the chipset 2. In other words, each chip 21 in the chipset 2 can be electrically connected to the logic chip 6, thereby facilitating the subsequent interconnection of signals between the chips 21 in each chipset 2 and the substrate board through the logic chip 6.

In some embodiments of the present disclosure, the orthographic projection of the chipset 2 on the carrier board 100 can be within the orthographic projection of the logic chip 6 on the carrier board 100. That is, the area of the logic chip 6 may be larger than the area of each chip 21 located between the top chip 211 and the carrier board 100, and also larger than the area of the top chip 211.

When there are multiple chipsets 2, all the chipsets 2 can be electrically connected to the logic chip 6. It should be noted that there may be one logic chip 6 formed between the carrier board 100 and the chipsets 2, or multiple logic chips 6 distributed at intervals along the direction parallel to the carrier board 100 may be formed, which is not specifically limited herein. When there is one logic chip 6 formed between the carrier board 100 and the chipsets 2, the chip 21 closest to the carrier board 100 in each chipset 2 can be electrically connected to the same logic chip 6. When the logic chips 6 distributed at intervals along the direction parallel to the carrier board 100 are formed between the carrier board 100 and the chipsets 2, each logic chip 6 can be electrically connected to at least one chipset 2, and different chipsets 2 are connected to different logic chips 6.

In one exemplary embodiment of the present disclosure, the conductive structure 5 may further extend from the chipset 2 to the logic chip 6, allowing for an electrical connection between the chipset 2 and the logic chip 6 through the conductive structure 5.

In an exemplary embodiment of the present disclosure, the method of forming a present disclosure according to the present disclosure may further include the step as follow.

In the step S170, after the grinding process, a cutting process is performed in the first spacing and the second spacing between the chipsets 2, to separate the chipsets 2.

After the grinding process for the insulating dielectric layer 3 and the top chip 211, the adjacent chipsets 2 can be separated by cutting. For example, the adjacent chipsets 2 can be separated at the first spacing and the second spacing between the adjacent chipsets 2. After separation, the insulating dielectric layer 3 is retained around the periphery of each chipset 2. The insulating dielectric layer 3 on the periphery of the separated chipsets 2 can be defined as the insulating layer 4.

It should be noted that during the cutting process, the insulating dielectric layer 3 can be at least partially retained in the first spacing. In other words, the insulating layer 4 can be at least partially retained on the side wall of the bottom chip 212.

Figure 8:
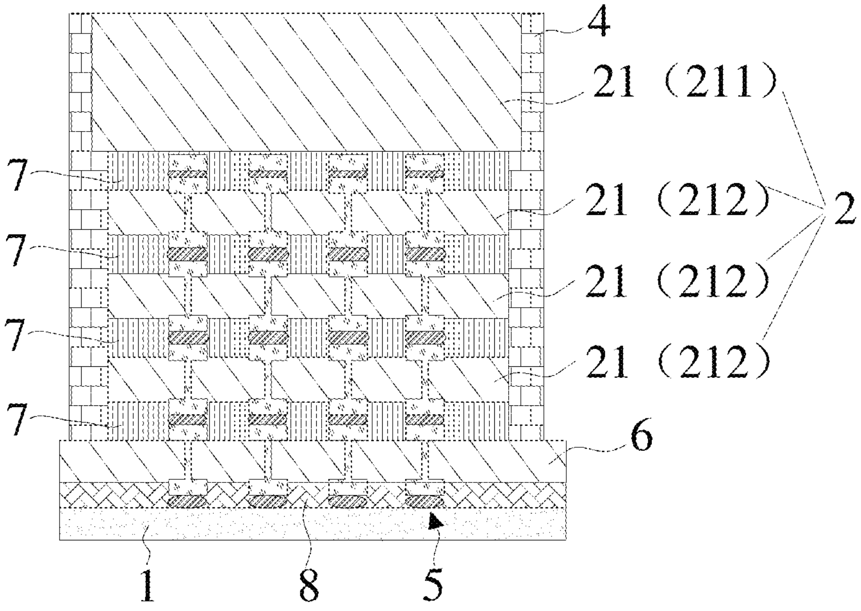
FIG. 8 is a schematic diagram of a semiconductor structure according to an embodiment of the present disclosure.

In an exemplary embodiment of the present disclosure, as shown in FIG. 8, the method of forming a semiconductor structure of the present disclosure may further include the step as follow.

In the step S180, after performing the cutting process, the carrier board 100 is removed; and a surface, which faces away from the chipset 2, of the logic chip 6 is electrically connected to a substrate board 1.

The substrate board 1 may include an array region and a peripheral region. The array region and the peripheral region can be adjacent to each other. The peripheral region surrounds the periphery of the array region. The array region may be used to form an external circuit connected to the chipset 2, while the peripheral region may be used to form other external circuits. For example, the array region may be a circular area, a rectangular area, or an irregularly shaped area. Certainly, the array region may be in other shapes, which is not specifically limited herein. The peripheral region may be a ring-shaped area that surrounds the periphery of the array region. The peripheral region may be a circular ring area, a rectangular ring area, or other ring-shaped areas. Specific examples are not listed here.

In one exemplary embodiment of the present disclosure, before the logic chip 6 is connected to the substrate board 1, the chipsets 2, the insulating fill layers 7, the insulating layer 4, the logic chip 6, and the conductive structures 5 can be formed on a carrier board 100. Subsequently, the carrier board 100 as well as the insulating adhesive 200 that adheres the carrier board 100 to the logic chip 6 can be removed, to expose the conductive structures 5 on the side surface of the logic chip 6 that faces away from the chipset 2, as shown in FIG. 7.

In some embodiments of the present disclosure, as shown in FIG. 8, the logic chip 6 can be adhered within the array region of the substrate board 1 by an adhesive layer 8. It should be noted that when the logic chip 6 is adhered to the substrate board 1 by the adhesive layer 8, the conductive structures 5 on the side surface of the logic chip 6 that faces away from the chipset 2 can be connected to the external circuits in the substrate board 1, thereby facilitating signal transmission through the external circuits. Since the chips 21 in the chipset 2 are electrically connected, and the chip 21 closest to the substrate board 1 is electrically connected to the logic chip 6, data signals from each chip 21 in the chipset 2 can be transmitted to the logic chip 6 through the chip 21 closest to the substrate board 1. Subsequently, the logic chip 6 transmits the data signals to the external circuits in the substrate board 1.

It should be noted that although the steps of the method of forming the semiconductor structure in the present disclosure are illustrated in the accompanying drawings in a particular sequence, it is not required or implied that the steps must be performed in that particular sequence or that all of the steps shown must be performed to achieve the desired results. Additionally or alternatively, some steps may be omitted, more than one steps may be combined into a single step for execution, and/or a single step may be divided into more than one steps for execution.

An embodiment of the present disclosure further provides a semiconductor structure. The semiconductor structure can be formed by the method of forming a semiconductor structure in any one of the foregoing embodiments. As shown in FIG. 8, the semiconductor structure includes a substrate board 1, a chipset 2, and an insulating layer 4.

The chipset 2 is arranged on one side of the substrate board 1 and includes multiple chips 21 stacked in a direction perpendicular to the substrate board 1; among multiple chips 21, the orthographic projection of the chip 21 closer to the substrate board 1 on the substrate board 1 is within the orthographic projection of the chip 21 farthest from the substrate board 1 on the substrate board 1.

The insulating layer 4 covers the periphery of the chipset 2, and a predetermined surface of the chip 21 farthest from the substrate board 1 is exposed outside the insulating layer 4.

The semiconductor structure of the present disclosure has the following beneficial effects. On one hand, the chips 21 are vertically stacked, which helps increase the storage capacity. On the other hand, among multiple chips 21, the orthographic projection of the chip 21 closer to the substrate board 1 on the substrate board 1 is within the orthographic projection of the chip 21 farthest from the substrate board 1 on the substrate board 1. In this way, the area of the top chip 211 can increase, and the thickness of the insulating layer 4 located on the periphery of the top chip 211 can reduce, without changing the overall size of the semiconductor structure, thereby facilitating heat dissipation. Furthermore, because the insulating layer 4 exposes the predetermined surface of the top chip 211, the heat exchange between the chip 21 and the external environment can be increased, which improves the heat dissipation efficiency and reduces power consumption during the operation of the chip 21.

The semiconductor structure in the present disclosure are illustrated in detail below.

As shown in FIG. 8, the substrate board 1 may be a flat structure, and in the shape of a rectangle, a circle, an ellipse, or a polygon, or in an irregular shape. The material of the substrate board may be a semiconductor material such as silicon, but is not limited thereto. The shape and material of the substrate board 1 are not particularly limited.

The substrate board 1 may include an array region and a peripheral region. The array region and the peripheral region can be adjacent to each other. The peripheral region surrounds the periphery of the array region. The array region may be used to form an external circuit connected to the chipset 2, while the peripheral region may be used to form other external circuits. For example, the array region may be a circular area, a rectangular area, or an irregularly shaped area. Certainly, the array region may be in other shapes, which is not specifically limited herein. The peripheral region may be a ring-shaped area that surrounds the periphery of the array region. The peripheral region may be a circular ring area, a rectangular ring area, or other ring-shaped areas. Specific examples are not listed here.

Further as shown in FIG. 8, the chipset 2 may be formed on one side of the substrate board 1, and can be electrically connected to the external circuit in the substrate board 1 to enable signal transmission. For example, the chipset 2 may be arranged in the array region of the substrate board 1. The chipset 2 may include multiple chips 21. The chipset 2 can be used in integrated circuits. For example, the chipset may be a dynamic random access memory (DRAM) or a static random access memory (SRAM), or may be a core component in a DRAM or SRAM. In some embodiments of the present disclosure, in order to reduce the size of the DRAM or SRAM while ensuring the storage capacity, the chips 21 may be stacked vertically with respect to the substrate board 1 to form the chipset 2. For example, the quantity of chips 21 in the chipset 2 may be 2, 3, 4, 5, 6, or 7. Certainly, it can be other quantities, which are not specifically limited herein.

In some embodiments of the present disclosure, all the chips 21 in the chipset 2 may be electrically connected, facilitating data transmission between multiple chips 21. This helps transmit data from multiple different chips 21 into the same chip 21, for simultaneously transmitting electrical signals from the chips 21 in the chipset 2 to the substrate board 1 through the same chip 21. In this way, each chip 21 can be connected to the external circuit, thereby enabling signal transmission.

In some embodiments of the present disclosure, all the chips 21 in the chipset 2 may be distributed at intervals along the direction perpendicular to the substrate board 1. For example, the chips 21 may be distributed along the direction perpendicular to the substrate board 1 at the same intervals. For instance, adjacent chips 21 may be spaced apart by a preset distance. Certainly, the spacings between the chips 21 do not have to be exactly same. For example, the spacing between at least two chips 21 among multiple chips 21 may be different from the spacing between other adjacent chips 21.

In some embodiments of the present disclosure, the preset distance can range from 10 μm to 150 μm. For example, the preset distance may be 10 μm, 40 μm, 70 μm, 100 μm, 130 μm, or 150 μm. Certainly, the preset distance may be other values, which are not listed here.

In one exemplary embodiment of the present disclosure, the chip 21 may have a sheet-like structure, and may be in the shape of a rectangle, a circle, an ellipse, or in an irregular shape, which is not specifically limited herein. The thickness of each chip 21 may be the same or different, which is not specifically limited herein. For example, the thickness of the chip 21 may range from 40 μm to 80 μm. For instance, the thickness may be 40 μm, 50 μm, 60 μm, 70 μm, or 80 μm. Certainly, other thicknesses are also possible, which are not listed here.

In some embodiments of the present disclosure, the chips 21 in the chipset 2 can have the same thickness. For example, the thickness of each chip 21 may be 50 μm, or each chip 21 may have a thickness of 60 μm, or each chip 21 may have a thickness of 70 μm. Certainly, each chip 21 may have other thicknesses, which are not listed here.

In one exemplary embodiment of the present disclosure, the chip 21 may include a substrate and a circuit module. The circuit module may be arranged on a surface of the substrate. In at least some of the chips 21, the surface of the substrate on which the circuit module is arranged may face towards the substrate board 1, while a surface without the circuit module may face towards a side of the chip 21 away from the substrate board 1. For example, in the substrate of the chip 21 that is farthest from the substrate board 1, the surface with the circuit module may face towards the substrate board 1. For instance, the substrate may be a wafer.

In one exemplary embodiment of the present disclosure, among the chips 21 in the chipset 2, the orthographic projection of the chip 21 closer to the substrate board 1 on the substrate board 1 is within the orthographic projection of the chip 21 farthest from the substrate board 1 on the substrate board 1. In order to better distinguish, the chip 21 farthest from the substrate board 1 may be defined as a top chip 211, and the chip 21 located between the top chip 211 and the substrate board 1 may be referred to as a bottom chip 212. In the direction parallel to the substrate board 1, the bottom chip 212 may have a first width, while the top chip 211 may have a second width, where the second width is greater than the first width. That is, in the chipset 2, the top chip 211 has a larger area than any other chip 21 in the chipset 2.

It should be noted that in the chipset 2, the chips 21 which are located between the top chip 211 and the substrate board 1 may have the same area or the different areas. That is, the chips 21 of the bottom chips 212 may have the same area or the different areas, which is not specifically limited here.

In some embodiments of the present disclosure, an insulating fill layer 7 may be provided between adjacent chips 21. The adjacent chips 21 can be insulated and isolated by the insulating fill layer 7, thereby preventing signal crosstalk or coupling between the chips 21.

In one exemplary embodiment of the present disclosure, the material of the insulating fill layer 7 may be an insulating adhesive or encapsulation adhesive. The insulating fill layer 7 can isolate the chips 21 from external water and oxygen, to prevent the external water and oxygen from entering the internal structure of the chips 21, thereby protecting the internal structure of the chips 21 from erosion by water and oxygen and extending the lifespan of the chips 21.

In some embodiments of the present disclosure, gaps between adjacent chips 21 can be filled with the insulating fill layer 7. The insulating fill layer 7 can support the gap between two adjacent chips 21 and help balance the stress between the two adjacent chips 21, thereby reducing the warping of the chips 21 and improving the yield of the product.

There may be multiple chipsets 2. The chipsets 2 are all formed on the same side of the substrate board 1. The orthographic projection of each chipset 2 on the substrate board 1 may be within an array region. For example, the chipsets 2 can be distributed at intervals and arranged in an array within the array region of the substrate board 1.

In some embodiments of the present disclosure, as shown in FIG. 4, the adjacent chips 21 in the same chipset 2 are electrically connected. For example, the adjacent chips 21 can be electrically connected through a conductive unit 51, and multiple spaced conductive units 51 may be arranged between the adjacent chips 21. In the direction perpendicular to the substrate board 1, the conductive units 51 in different chips 21 may be interconnected to form conductive structures 5.

It should be noted that, as shown in FIG. 8, when the insulating fill layer 7 is formed between adjacent chips 21, the conductive structures 5 can penetrate through the insulating fill layer 7.

As shown in FIG. 8, the insulating layer 4 may be formed on the side wall of the chipset 2 by the methods such as chemical vapor deposition, physical vapor deposition, or atomic layer deposition. Certainly, other methods can also be used to form the insulating layer 4, which are not listed here. The material of the insulating layer 4 may be an insulating material. The chipset 2 can be insulated and isolated by the insulating layer 4, to prevent coupling or short-circuiting between the chipset 2 and other surrounding structures, thus improving the product yield.

It should be noted that when multiple chipsets 2 are formed on one side of the substrate board 1, side walls of all the chipsets 2 can be provided with the insulating layer 4, thereby avoiding coupling or short-circuiting between adjacent chipsets 2 and improving the product yield.

In some embodiments of the present disclosure, in the direction parallel to the substrate board 1, a ratio of the width of the top chip 211 to the thickness of the insulating layer 4 on the side wall of the top chip 211 may range from 5 to 20. For example, the ratio of the width of the top chip 211 to the thickness of the insulating layer 4 on the side wall of the top chip 211 may be 5, 10, 15, or 20. Certainly, the ratio may be other values, which are not listed here.

In some embodiments of the present disclosure, in the direction parallel to the substrate board, the thickness of the insulating layer 4 on the side wall of the top chip 211 is not greater than the thickness of the insulating layer 4 on the side wall of the bottom chip 212. For example, the thickness of the insulating layer 4 on the side wall of the top chip 211 may be greater than or equal to 50 micrometers, and less than or equal to 100 micrometers. Compared with the thickness of 200 micrometers in the prior art, the thickness of the insulating layer 4 on the side wall of the top chip 211 is greatly reduced. For example, the thickness of the insulating layer 4 on the side wall of the top chip 211 may be 50, 60, 70, 80, 90, or 100 micrometers. Certainly, the thickness of the insulating layer 4 on the side wall of the top chip 211 may be other values, which are not listed here.

It should be noted that in the direction perpendicular to the substrate board 1, the chips 21 between the top chip 211 and the substrate board 1 can be aligned at both ends. That is, the chips 21 in the bottom chips 212 can be aligned at both ends. The insulating layer 4 on the periphery of each chip 21 in the bottom chips 212 can have the same thickness. Moreover, the thickness of the insulating layer 4 on the periphery of each chip 21 in the bottom chips 212 can be greater than the thickness of the insulating layer 4 on the periphery of the top chip 211.

In some embodiments of the present disclosure, the semiconductor structure of the present disclosure may further include a logic chip 6. Further as shown in FIG. 7 and FIG. 8, the logic chip 6 can be formed between the substrate board 1 and the chipset 2, and can be adhered to the substrate board 1 by an adhesive layer 8. The material of the adhesive layer 8 may be a non-conductive adhesive, a UV adhesive, or the like. The logic chip 6 is provided with conductive structures 5 on a side surface that faces away from the chipset 2. That is, the chips 21 in each chipset 2 can be electrically connected to the logic chip 6, such that signals in the chips 21 in each chipset 2 can be interconnected with the substrate board 1 through the logic chip 6 subsequently.

In some embodiments of the present disclosure, the logic chip 6 can be electrically connected to the chip 21 closest to the substrate board 1 in the chipset 2. Since the chips 21 in the chipset 2 are electrically connected, and the chip 21 closest to the substrate board 1 is electrically connected to the logic chip 6, data signals from each chip 21 in the chipset 2 can be transmitted to the logic chip 6 through the chip 21 closest to the substrate board 1. Subsequently, the logic chip 6 transmits the data signals to the external circuits in the substrate board 1.

In one exemplary embodiment of the present disclosure, the orthographic projection of the chipset 2 on the substrate board 1 can be within the orthographic projection of the logic chip 6 on the substrate board 1. That is, the area of the logic chip 6 may be larger than the area of each chip 21 located between the top chip 211 and the substrate board 1, and also larger than the area of the top chip 211.

When there are multiple chipsets 2, all the chipsets 2 can be electrically connected to the logic chip 6. It should be noted that there may be one logic chip 6 formed between the substrate board 1 and the chipsets 2, or multiple logic chips 6 distributed at intervals along the direction parallel to the substrate board 1 may be formed, which is not specifically limited herein. When there is one logic chip 6 formed between the substrate board 1 and the chipsets 2, the chip 21 closest to the substrate board 1 in each chipset 2 can be electrically connected to the same logic chip 6. When the logic chips 6 distributed at intervals along the direction parallel to the substrate board 1 are formed between the substrate board 1 and the chipsets 2, each logic chip 6 can be electrically connected to at least one chipset 2, and different chipsets 2 are connected to different logic chips 6.

In one exemplary embodiment of the present disclosure, the conductive structure 5 may further extend from the chipset 2 to the logic chip 6, allowing for an electrical connection between the chipset 2 and the logic chip 6 through the conductive structure 5.

An embodiment of the present disclosure further provides a memory. The memory may include the semiconductor structure in any one of the foregoing embodiments. The specific details, forming process, and beneficial effects thereof have been illustrated in detail in the corresponding semiconductor structure and the method of forming the semiconductor structure. Therefore, details are not described herein again.

For example, the memory may be a dynamic random access memory (DRAM), a static random access memory (SRAM), or the like. Certainly, other storage apparatuses may also be used, which are not listed herein.

Those skilled in the art may easily figure out other implementation solutions after considering the specification and practicing the present disclosure. The present disclosure aims to cover any modifications, purposes or adaptive changes of the present disclosure. Such modifications, purposes or applicable changes follow the general principle of the present disclosure and include common knowledge or conventional technical means in the technical field which is not disclosed in the present disclosure. It should be construed that the specification and embodiments disclosed here are merely considered as illustrative, and the scope and spirit of the present disclosure are indicated by the accompanying claims.

What is claimed:

1. A method of forming a semiconductor structure, comprising:

providing a carrier board;

forming a chipset on one side of the carrier board, wherein the chipset comprises a plurality of chips stacked in a direction perpendicular to the carrier board; wherein among the plurality of chips, an orthographic projection of a chip closer to the carrier board on the carrier board is within an orthographic projection of a chip farthest from the carrier board on the carrier board;

forming an insulating dielectric layer covering the chipset; and performing a grinding process to expose a predetermined surface of the chip farthest from the carrier board outside the insulating dielectric layer, wherein performing the grinding process to expose the predetermined surface of the chip farthest from the carrier board outside the insulating dielectric layer comprises:

grinding to remove the insulating dielectric layer by a first target thickness, to expose a top surface of the top chip; and grinding to remove the top chip and the insulating dielectric layer by a second target thickness, to expose the predetermined surface of the top chip, the second target thickness being not greater than the first target thickness.

2. The method of forming a semiconductor structure of claim 1, wherein a plurality of chipsets are provided, and the chipsets are distributed at intervals;

gaps between the plurality of chipsets are filled with the insulating dielectric layer;

each of the plurality of chipsets comprises a bottom chip and a top chip; in a direction parallel to the carrier board, a first spacing exists between adjacent bottom chips, and a second spacing exists between adjacent top chips; and a width of the second spacing is less than a width of the first spacing.

3. The method of forming a semiconductor structure of claim 2, wherein in the direction parallel to the carrier board, the bottom chip has a first width, the top chip has a second width, and the second width is greater than the first width.

4. The method of forming a semiconductor structure of claim 2, wherein each of the plurality of chips comprises a substrate and a circuit module formed on a surface of the substrate; and in the top chip, a surface on which the circuit module is formed faces towards the carrier board.

5. The method of forming a semiconductor structure of claim 2, further comprising:

forming a logic chip between the plurality of chipsets and the carrier board, wherein an orthographic projection of the plurality of chipsets on the carrier board is within an orthographic projection of the logic chip on the carrier board.

6. The method of forming a semiconductor structure of claim 5, further comprising:

after the grinding process, performing a cutting process in the first spacing and the second spacing between the plurality of chipsets to separate the plurality of chipsets.

7. The method of forming a semiconductor structure of claim 6, wherein during the cutting process, the insulating dielectric layer is at least partially retained in the first spacing.

8. The method of forming a semiconductor structure of claim 6, further comprising:

removing the carrier board after performing the cutting process, and electrically connecting a surface of the logic chip facing away from the chipset to a substrate board.

9. The method of forming a semiconductor structure of claim 3, further comprising:

forming a logic chip between the chipset and the carrier board, wherein an orthographic projection of the chipset on the carrier board is within an orthographic projection of the logic chip on the carrier board.

10. The method of forming a semiconductor structure of claim 1, further comprising:

forming a logic chip between the chipset and the carrier board, wherein an orthographic projection of the chipset on the carrier board is within an orthographic projection of the logic chip on the carrier board.

11. The method of forming a semiconductor structure of claim 4, further comprising:

forming a logic chip between the chipset and the carrier board, wherein an orthographic projection of the chipset on the carrier board is within an orthographic projection of the logic chip on the carrier board.

12. A semiconductor structure configured to perform the method of claim 1, comprising:

a substrate board;

a chipset, arranged on one side of the substrate board and comprising a plurality of chips stacked in a direction perpendicular to the substrate board, wherein among the plurality of chips, an orthographic projection of a chip closer to the substrate board on the substrate board is within an orthographic projection of a chip farthest from the substrate board on the substrate board; and an insulating layer, covering a periphery of the chipset, wherein a predetermined surface of the chip farthest from the substrate board is exposed outside the insulating layer.

13. The semiconductor structure of claim 12, wherein the chipset comprises a bottom chip and a top chip; and in a direction parallel to the substrate board, a thickness of the insulating layer on a side wall of the top chip is not greater than a thickness of the insulating layer on a side wall of the bottom chip.

14. The semiconductor structure of claim 13, wherein in the direction parallel to the substrate board, the bottom chip has a first width, the top chip has a second width, and the second width is greater than the first width.

15. The semiconductor structure of claim 13, wherein each of the chips comprises a substrate and a circuit module formed on a surface of the substrate; and in the top chip, the surface on which the circuit module is formed faces towards the substrate board.

16. The semiconductor structure of claim 12, further comprising:

a logic chip disposed between the substrate board and the chipsets, wherein an orthographic projection of the chipsets on the substrate board is within an orthographic projection of the logic chip on the substrate board.

17. The semiconductor structure of claim 13, further comprising:

a logic chip disposed between the substrate board and the chipset, wherein an orthographic projection of the chipset on the substrate board is within an orthographic projection of the logic chip on the substrate board.

18. The semiconductor structure of claim 14, further comprising:

a logic chip disposed between the substrate board and the chipset, wherein an orthographic projection of the chipset on the substrate board is within an orthographic projection of the logic chip on the substrate board.

19. A memory, comprising the semiconductor structure of claim 12.

* * * * *